United States Patent [19]
Alexander

[11] 3,790,907
[45] Feb. 5, 1974

[54] LATTICE SOFTENING VARIABLE DELAY LINE

[75] Inventor: Edward M. Alexander, College Park, Md.

[73] Assignee: The United States of America as represented by the Secretary of the Navy, Washington, D.C.

[22] Filed: Mar. 30, 1973

[21] Appl. No.: 346,538

[52] U.S. Cl. ................................ 333/30 R, 333/72
[51] Int. Cl......... H03h 7/20, H03h 7/36, H03h 9/30
[58] Field of Search...... 333/30 R, 30 M, 29, 72, 71

[56] References Cited

OTHER PUBLICATIONS

"Type 605 Precision Variable Delay Line" Advance Electronics Co., Passaic, N.J. (Advertisement) 3/23/1956; 1 sheet "Continuously Variable Time Delay" – Advance Electronics Lab., Inc. Passaic, N.J. (Advertisement) 3/23/1956; 1 sheet

*Primary Examiner*—James W. Lawrence
*Assistant Examiner*—Marvin Nussbaum
*Attorney, Agent, or Firm*—R. S. Sciascia; Arthur L. Branning

[57] ABSTRACT

A device for providing a continuously variable delay for successive pulses in a rf pulse train or for individual pulses by using the principle of variable velocity of acoustic waves in materials in which phonons soften. By employing a series of phonon softening devices, each contributes to the desired total delay while introducing a minimum amount of attenuation.

18 Claims, 1 Drawing Figure

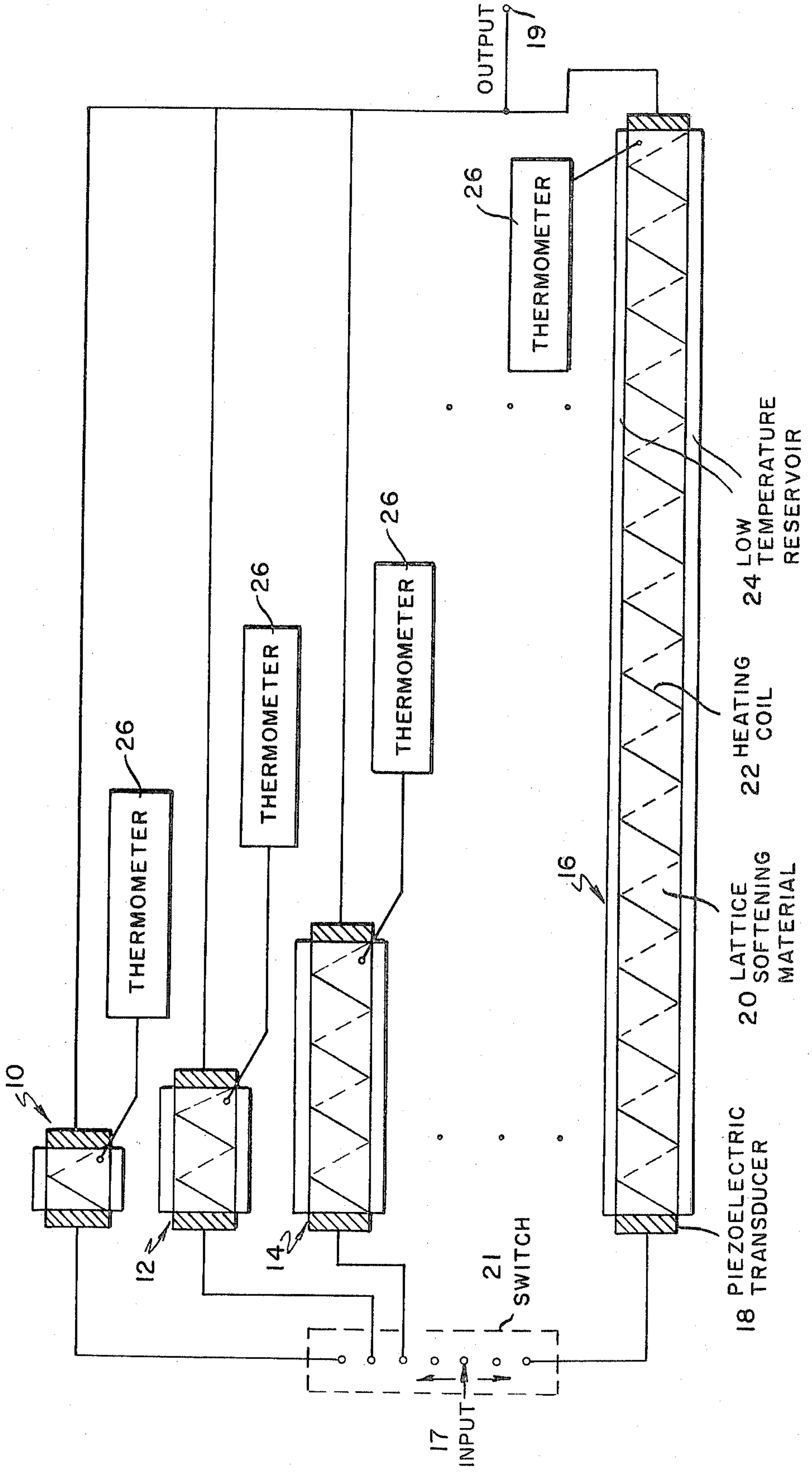
OUTPUT
19
THERMOMETER
26
THERMOMETER
26
THERMOMETER
26
THERMOMETER
26
10
12
14
16
24 LOW TEMPERATURE RESERVOIR
22 HEATING COIL
20 LATTICE SOFTENING MATERIAL
18 PIEZOELECTRIC TRANSDUCER
21 SWITCH
17 INPUT

LATTICE SOFTENING VARIABLE DELAY LINE

BACKGROUND OF THE INVENTION

The present invention relates generally to delay lines and more specifically to phonon softening variable delay lines. Two types of devices are presently possible for nondispersive variable delay at high frequency. The first of these is an acousto-optic device which relies on the interaction of an acoustic wave generated in a crystal and a laser beam. Such a system has been disclosed by Oscar Farah in application, Ser. No. 256,750 filed May 25, 1972 and entitled "A Continuously Variable Delay Line." Using piezoelectric materials, the acoustic wave is generated in the crystalline material from an RF source. A laser beam is located a variable distance from the piezoelectric material in accordance with the desired delay. An optical detector is arranged to detect variations caused in the laser beam due to the propagation of the acoustic wave along the crystal. As a result, a continuously variable delay can be achieved with a minimum amount of attenuation. Unfortunately, an inherent limitation of the device is its narrow bandwidth.

The second device known to the prior art relies on the principle of parametric generation of an idler wave from the non-linear interaction between an acoustic wave and an RF pulse in a piezoelectric material. The RF signal to be delayed is applied to a piezoelectric transducer and an acoustic wave is thereby generated along the length of the piezoelectric material. A microwave RF impulse is applied to the piezoelectric material at a particular time when the acoustic signal has reached a particular point along the length of the piezoelectric material. An idler wave is then parametrically generated at that point and reflected back to the source input transducer where it is detected. Since the idler wave corresponds to the original input, it represents a delayed version of the input wave at detection. Unfortunately this device is limited to delays equal to or greater than the pulse length of the input wave and requires kilowatts of power for the RF impulse to get a substantial idler return.

SUMMARY OF THE INVENTION

Considering the prior art I have described a device for providing a continuously variable delay without the drawbacks set forth above. Specifically, the instant invention is able to realize a large bandwidth only to be limited by the piezoelectric transducer in it. Furthermore this device has a minimum delay approaching 0 Nsec.

It is therefore the object of the present invention to provide a device for continuously varying the delay of RF pulses over a broad band of frequencies up to S band and possibly higher.

It is also the object of the present invention to provide continuously variable delays from as near 0 to a selected maximum delay.

An additional object of the present invention is to provide a variable delay device having minimum attenuation.

Other objects, advantages and novel features of the invention will become apparent from the following detailed description of the invention when considered in conjunction with the accompanying drawing.

Ferroelectric and $\beta$-Tungsten materials, which typify the class of materials that experience large acoustic velocity changes at structural phase transformations when changing external parameters are employed to provide a variable delay. This device achieves these results at long delay ranges through the use of a set of delay elements having small delay ranges covering successive parts of the total desired delay range. Since the variable delay range of each element due to temperature change could be made small, the resulting attenuation would be correspondingly small.

BRIEF DESCRIPTION OF THE DRAWING

The FIGURE shows the preferred embodiment of the invention.

DETAILED DESCRIPTION

This invention relies on the physical properties of crystals of materials such as ferroelectrics or $\beta$-Tungsten materials which experience large velocity changes at structural phase transformations when changing external parameters.

At these transformations there is a decrease in frequency for a particular branch of the optic or acoustic dispersion curves, a phenomenon conventionally known as phonon softening. The change in acoustic velocity occurs either because of the direct decrease in frequency of the acoustic dispersion curve or by a decrease in frequency of the acoustic dispersion curve caused by interaction with a softening optic phonon branch. In these classes of materials, phonons are known to soften as the temperature of the material is changed around the material transition temperature and cause radical changes (order of magnitude) in the propagation velocity of acoustic waves. The delay in propagation is therefore determined not only by the length of the delay material but also by the acoustic velocity in the transmission medium. Thus by varying the temperature near the transition temperature of the material, the delay can be varied. The delay device consists of a cylindrical rod 20 (as shown in the FIGURE) of phonon softening material such as a ferroelectric material or $\beta$-Tungsten material. The cylindrical rod 20 has piezoelectrical transducers 18 bonded on its end faces which act as to convert input RF electrical signals to acoustic waves and vice versa. Temperature is changed in 20 by employing heating coil 22 and low temperature reservoir 24. Current is passed through the heating coils 22 to heat the cylindrical rods 20. Low temperature reservoir 24 is placed in moderate thermal contact with the cylindrical rod 20 for cooling the rod. A temperature sensor 26 can be placed on the rod 20 for monitoring its temperature.

The acoustic attenuation in the above device increases greatly for a corresponding change in acoustic velocity. The device as shown in the FIGURE overcomes these problems of attenuation by using a series of delay devices 10, 12, 14 and 16, etc. Switch 21 functions to select the particular delay device to which the input 17 is connected. A continuously variable delay is achieved by applying the input 17 successively to each of the delay devices 10, 12, 14 . . . 16. For example, at initial temperature $T_i$, delay device 10 has a delay equal to D(10, *i*). By changing the temperature of the rod 20 in delay device 10 from its initial temperature $T_i$ to some final temperature $T_f$, a corresponding delay change is produced to delay D(10, *f*). Both $T_i$ and $T_f$ are near the structure phase transition temperature. Temperature $T_f$ is selected such that the delay D(10, *f*)

of delay device 10 at $T_f$ is equal to the delay D(12, *i*) in delay device 12 at initial temperature $T_i$. By switching the input 20 from delay device 10, when it has reached $T_f$, to delay device 12 at $T_i$ a continuous delay is produced. If this process is continued over the entire set of delay devices, any desired delay or delay change can be produced with a minimum amount of attenuation.

By using a set of delay devices, the change in temperature and therefore the change in delay propagation for each device can be made small. As a result, the attenuation can be kept to a minimum level. Clearly, as more stages are used, less attenuation will be present. In a limiting case, an infinite number of stages would produce a maximum delay equal to the propagation time of the longest delay device at its initial temperature $T_i$.

The disclosed invention has many advantages over the prior devices. It overcomes the narrow bandwidth problem of the laser acoustic device and the minimum delay and high power requirements of the parametric interaction device. For these reasons its operation is clearly superior to the prior art.

Obviously many modifications and variations of the present invention are possible in the light of the above teachings. For example, the phonon softening process and thereby the delay may also be controlled by parameters other than temperature, such as electric field, magnetic field, or hydrostatic pressure. It is therefore to be understood that within the scope of the appended claims the invention may be practiced otherwise than as specifically described.

What is claimed and desired to be secured by Letters Patent of the United States is:

1. A multichannel variable delay line for delaying an input RF signal by a selected delay comprising:

a set of variable delay means each having a different preselected variable delay range for delaying said input RF signal, each of said delay means comprising a ferroelectric rod having a heating coil and low temperature reservoir in thermal contact therewith for varying the temperature of said rod;

means for switching said input RF signal to a particular variable delay means in said set of variable delay means wherein said particular variable delay means has a delay range corresponding to said selected delay; and output means connected to said set of variable delay means for reading out said delayed RF signal.

2. The device of claim 1 wherein said rods have piezoelectric material bonded thereon.

3. A multichannel variable delay line for delaying an input RF signal by a selected delay comprising:

a set of variable delay means each having a different preselected variable delay range for delaying said input RF signal, each of said delay means comprising a tungsten material rod having a heating coil and low temperature reservoir in thermal contact therewith for varying the temperature of said rod;

means for switching said input RF signal to a particular variable delay means in said set of variable delay means wherein said particular variable delay means has a delay range corresponding to said selected delay; and output means connected to said set of variable delay means for reading out said delayed RF signal.

4. The device of claim 3 wherein said rods have piezoelectric material bonded thereon.

5. A delay line for variably delaying an input RF signal by a selected delay interval comprising:

a crystalline material having end faces;

piezoelectric transducers bonded to said end faces;

means for inducing a structural phase transformation in said crystalline material to vary said delay.

6. A delay line for variably delaying an input RF signal by a selected delay interval comprising:

a crystalline material having end faces;

piezoelectric transducers bonded to said end faces to convert said RF signals to acoustic waves in said crystalline material;

means for inducing a structural phase transformation in said crystalline material so as to cause changes in the velocity of said acoustic wave at said structural phase transformations.

7. The delay line of claim 6 wherein said crystalline material comprises a ferroelectric.

8. The delay line of claim 6 wherein said crystalline material comprises a $\beta$-Tungsten material.

9. The device of claim 6 wherein said means for inducing a structural phase transformation comprises means for varying the temperature in said crystalline material.

10. The device of claim 6 wherein said means for inducing a structural phase transformation comprises means for varying the electric field in said crystalline material.

11. The device of claim 6 wherein said means for inducing a structural phase transformation comprises means for varying the magnetic field in said crystalline material.

12. The device of claim 6 wherein said means for inducing a structural phase transformation comprises means for varying the hydrostatic pressure in said crystalline material.

13. The device of claim 7 wherein said means for inducing a structural phase transformation comprises means for varying the temperature in said crystalline material.

14. The device of claim 7 wherein said means for inducing a structural transformation comprises means for varying the electric field in said crystalline material.

15. The device of claim 7 wherein said means for inducing a structural phase transformation comprises means for varying the hydrostatic pressure in said crystalline material.

16. The device of claim 8 wherein said means for inducing a structural phase transformation comprises means for varying the temperature in said crystalline material.

17. The device of claim 8 wherein said means for inducing a structural phase transformation comprises means for varying the magnetic field in said crystalline material.

18. The device of claim 8 wherein said means for inducing a structural phase transformation comprises means for varying the hydrostatic pressure in said crystalline material.

* * * * *